United States Patent
Dutta et al.

(10) Patent No.: US 10,892,404 B1
(45) Date of Patent: Jan. 12, 2021

(54) SACRIFICIAL BUFFER LAYER FOR METAL REMOVAL AT A BEVEL EDGE OF A SUBSTRATE

(71) Applicant: International Business Machines Corporation, Armonk, NY (US)

(72) Inventors: Ashim Dutta, Menands, NY (US); Saba Zare, Albany, NY (US); Michael Rizzolo, Delmar, NY (US); Theodorus E. Standaert, Clifton Park, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/506,459

(22) Filed: Jul. 9, 2019

(51) Int. Cl.
| | |
|---|---|
| *H01L 21/00* | (2006.01) |
| *H01L 43/12* | (2006.01) |
| *H01L 43/08* | (2006.01) |
| *G11C 11/16* | (2006.01) |
| *H01L 27/22* | (2006.01) |
| *H01L 43/10* | (2006.01) |

(52) U.S. Cl.
CPC .......... *H01L 43/12* (2013.01); *G11C 11/161* (2013.01); *H01L 27/228* (2013.01); *H01L 43/08* (2013.01); *H01L 43/10* (2013.01)

(58) Field of Classification Search
CPC ........ H01L 43/12; H01L 43/10; G11C 11/161
See application file for complete search history.

(56) References Cited

U.S. PATENT DOCUMENTS

| | | | |
|---|---|---|---|
| 6,309,981 B1 | 10/2001 | Mayer et al. | |
| 6,586,342 B1 | 7/2003 | Mayer et al. | |
| 6,833,063 B2 | 12/2004 | Basol | |
| 6,984,585 B2 | 1/2006 | Ying et al. | |
| 7,208,326 B2* | 4/2007 | Rennie | H01L 21/3065 257/E21.218 |
| 8,419,964 B2* | 4/2013 | Ganesan | H01L 21/6708 216/92 |
| 8,426,312 B2* | 4/2013 | Richter | H01L 21/02087 438/689 |
| 8,501,283 B2* | 8/2013 | Shin | H01L 21/67017 427/569 |
| 2007/0066076 A1 | 3/2007 | Bailey et al. | |

(Continued)

*Primary Examiner* — Laura M Menz
(74) *Attorney, Agent, or Firm* — James Nock; Ryan, Mason & Lewis, LLP (57) ABSTRACT

A method of forming a semiconductor structure includes forming a dielectric layer surrounding contacts over a top surface and bevel edge of a substrate, forming a sacrificial buffer layer over the dielectric layer, removing portions of the sacrificial buffer layer formed over the dielectric layer on the top surface of the substrate, and patterning device structures including one or more metal layers over the contacts, wherein patterning the device structures removes portions of the metal layers formed over the top surface of the substrate leaving the metal layers on the bevel edge. The method also includes forming an encapsulation layer and performing a bevel dry etch to remove the encapsulation layer and the metal layers on the bevel edge. The bevel dry etch damages the sacrificial buffer layer on the bevel edge underneath the metal layers. The method further includes removing the damaged sacrificial buffer layer from the bevel edge.

16 Claims, 6 Drawing Sheets

(56) References Cited

U.S. PATENT DOCUMENTS

| | | | |
|---|---|---|---|
| 2007/0068900 A1* | 3/2007 | Kim | H01J 37/3244 216/67 |
| 2010/0055924 A1* | 3/2010 | Ganesan | H01L 21/02087 438/748 |
| 2015/0221517 A1* | 8/2015 | Kim | H01L 21/304 438/460 |
| 2018/0226390 A1* | 8/2018 | Kang | H01L 25/0657 |

* cited by examiner

SACRIFICIAL BUFFER LAYER FOR METAL REMOVAL AT A BEVEL EDGE OF A SUBSTRATE

BACKGROUND

The present application relates to semiconductors, and more specifically, to techniques for forming semiconductor structures. Magnetoresistive random access memory (MRAM) is a non-volatile computer memory (NVRAM) technology. In some conventional random access memory (RAM) devices, data is stored as electric charge or current flows. MRAM, in contrast, stores data using magnetic storage elements. Such elements may be formed using two ferromagnetic plates separated by a thin insulating later. Spin transfer torque MRAM (STT-MRAM) is a type of MRAM device in which the spin of electrons can be flipped using a spin-polarized current in a magnetic tunnel junction (MTJ).

SUMMARY

Embodiments of the invention provide techniques for removal of metal from a wafer bevel using a sacrificial buffer layer.

In one embodiment, a method of forming a semiconductor structure comprises forming one or more contacts over a top surface of a substrate, forming a dielectric layer surrounding the one or more contacts over the top surface and a bevel edge of the substrate, and forming a sacrificial buffer layer over the dielectric layer on the top surface and the bevel edge of the substrate. The method also comprises removing portions of the sacrificial buffer layer formed over the dielectric layer on the top surface of the substrate leaving the sacrificial buffer layer on the bevel edge of the substrate, and patterning one or more device structures comprising one or more metal layers over the one or more contacts, wherein patterning the one or more device structures comprises removing portions of the one or more metal layers formed over the dielectric layer on the top surface of the substrate leaving the one or more metal layers on the bevel edge of the substrate. The method further comprises forming an encapsulation layer over the one or more device structures and the dielectric layer on the top surface of the substrate, and performing a bevel dry etch to remove the encapsulation layer and the one or more metal layers on the bevel edge of the substrate, the bevel dry etch damaging the sacrificial buffer layer on the bevel edge underneath the one or more metal layers. The method further comprises removing the damaged sacrificial buffer layer from the bevel edge of the substrate.

In another embodiment, a semiconductor structure comprises a substrate, one or more contacts disposed on a top surface of the substrate, a dielectric layer surrounding the one or more contacts disposed on the top surface of the substrate and a bevel edge of the substrate, a sacrificial buffer layer disposed over the dielectric layer on the bevel edge of the substrate, and one or more device structures patterned over the one or more contacts on the top surface of the substrate, the one or more device structures comprising one or more metal layers also disposed over the sacrificial buffer layer on the bevel edge of the substrate. The semiconductor structure may also comprise a hard mask layer disposed over the one or more device structures and the one or more metal layers on the bevel edge of the substrate, and an encapsulation layer disposed over (i) the hard mask layer, the one or more device structures and the dielectric layer on the top surface of the substrate and (ii) the hard mask layer on the bevel edge of the substrate.

In another embodiment, an integrated circuit comprises a magnetic random-access memory structure comprising a substrate, one or more contacts disposed on a top surface of the substrate, a dielectric layer surrounding the one or more contacts disposed on the top surface of the substrate and a bevel edge of the substrate, a sacrificial buffer layer disposed over the dielectric layer on the bevel edge of the substrate, and one or more magnetic tunnel junction stacks for one or more magnetic random-access memory elements patterned over the one or more contacts on the top surface of the substrate, the one or more magnetic tunnel junction stacks comprising one or more metal layers also disposed over the sacrificial buffer layer on the bevel edge of the substrate. The magnetic random-access memory structure also comprises a hard mask layer disposed over the one or more magnetic tunnel junction stacks and the one or more metal layers on the bevel edge of the substrate, and an encapsulation layer disposed over (i) the hard mask layer, the one or more magnetic tunnel junction stacks and the dielectric layer on the top surface of the substrate and (ii) the hard mask layer on the bevel edge of the substrate.

DETAILED DESCRIPTION

Illustrative embodiments of the invention may be described herein in the context of illustrative methods for metal removal from a wafer bevel using a sacrificial buffer layer, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

In some semiconductor structures, memory elements are embedded into the back-end-of-line (BEOL). This, however, presents challenges related to the removal of materials from a substrate or wafer bevel to avoid flaking and other contamination. As an example, some metal materials used for magnetic random-access memory (MRAM) structures do not produce volatile products during plasma etching and are not soluble in known, fabrication-friendly wet etch chemistries. As such, etching such metal materials can result in bevel metal contamination.

Bevel metal contamination results from insufficient metal removal causing micro-masking. Micro-masking occurs primarily on the bevel of the wafer, though in some cases may extend to the front surface or top side of the wafer. Micro-masking occurs when a bevel dry etch (e.g., bevel reactive-ion etching (ME)) causes redeposition of non-volatile etch by-product(s) on the underlying stack while etching a stack of metals (e.g., for a magnetic tunnel junction (MTJ) stack of an MRAM memory structure) at the bevel.

MRAM devices may include a grid or other arrangement of multiple cells. Spin transfer torque MRAM (STT-MRAM), as mentioned above, is a type of MRAM device in which the spin of electrons can be flipped using a spin-polarized current in a MTJ. STT-MRAM can provide a number of advantages, including reduced power consumption and cost. Particularly, STT-MRAM provides advantages in scaling permitting higher densities of MRAM cells at a lower cost. MTJs in MRAM devices generally comprise an insulating layer (e.g., the tunnel junction) formed between two or more ferromagnetic layers. Materials used for the MTJ stack or electrodes of MRAM device (e.g., iron (Fe), nickel (Ni), cobalt (Co), chromium (Cr), etc.) as noted above, can be difficult to remove from the bevel of a wafer or substrate.

An extended bevel over-etch removes metal materials from the bevel of the wafer, but causes micro-masking due to redeposition of non-volatile etch by-products. The micro-masking damages the underlying wafer (e.g., which may be formed of silicon (Si)), forming pitting on the bevel surface or formation of needles on the bevel surface. The pitted surface (e.g., of Si) can trap metal residues, which later move to the front surface or top side of the wafer during downstream wet clean processing. Similarly, the needles (e.g., of Si) can break off during downstream wet clean processing and redeposit on the front surface or top side of the wafer producing potential contamination of the resulting structure.

Illustrative embodiments provide techniques for removing metal materials from the bevel of a substrate or wafer using a bevel dry etch (e.g., bevel-RIE) after formation and encapsulation of structures for memory elements in the BEOL (e.g., after forming and encapsulating MTJ pillars for MRAM memory elements). To do so, a sacrificial buffer layer (e.g., formed of a dielectric material) is deposited on the wafer before MRAM stack deposition. The sacrificial buffer layer is then removed from the front side or top surface of the wafer using RIE processing leaving the sacrificial buffer layer only on the bevel of the wafer. The MRAM stack is then deposited, patterned and encapsulated. During this processing, MRAM stack metals and encapsulation materials are deposited above the sacrificial buffer layer at the wafer bevel. Bevel-ME is then used to remove the encapsulation material and MRAM metals (e.g., of the MTJ stack) from the bevel. This bevel-RIE damages the underlying sacrificial buffer layer and forms a pitted surface or needles due to micro-masking by redeposition of some of the non-volatile metals (e.g., from the MRAM stack). The damaged sacrificial buffer layer is then removed using a wet bevel etch or ion beam etching (IBE) (e.g., high angle IBE such as with an angle greater than 90 degrees) leaving undamaged underlying films on the bevel surface of the wafer.

Embodiments also include structures for enhancing metal contamination removal on wafer bevels, where all metal layers and encapsulation layers are removed from the bevel of a wafer. A damaged portion or residue of the sacrificial buffer layer remains on the bevel of the wafer, but the underlying wafer material (e.g., Si) is not exposed and thus does not have a pitted surface or needles.

Conventional techniques for removal of metal materials from the bevel edge of wafer may use wet etches, a direct stream of liquid chemical etchants, bevel dry etches, dilute liquid chemical etchants, etc. Such techniques, however, do not adequately remove some materials used for device structures (e.g., of an MTJ stack for MRAM structures), which are difficult to etch. Such techniques may also require dedicated tool sets (e.g., for direct plasma etch of contamination at the bevel edge) and may encounter issues due to RIE partial breakthrough of films.

An illustrative process for removing metal materials from the bevel of a substrate or wafer will now be described in further detail with respect to FIGS. 1-9.

Figure 1:
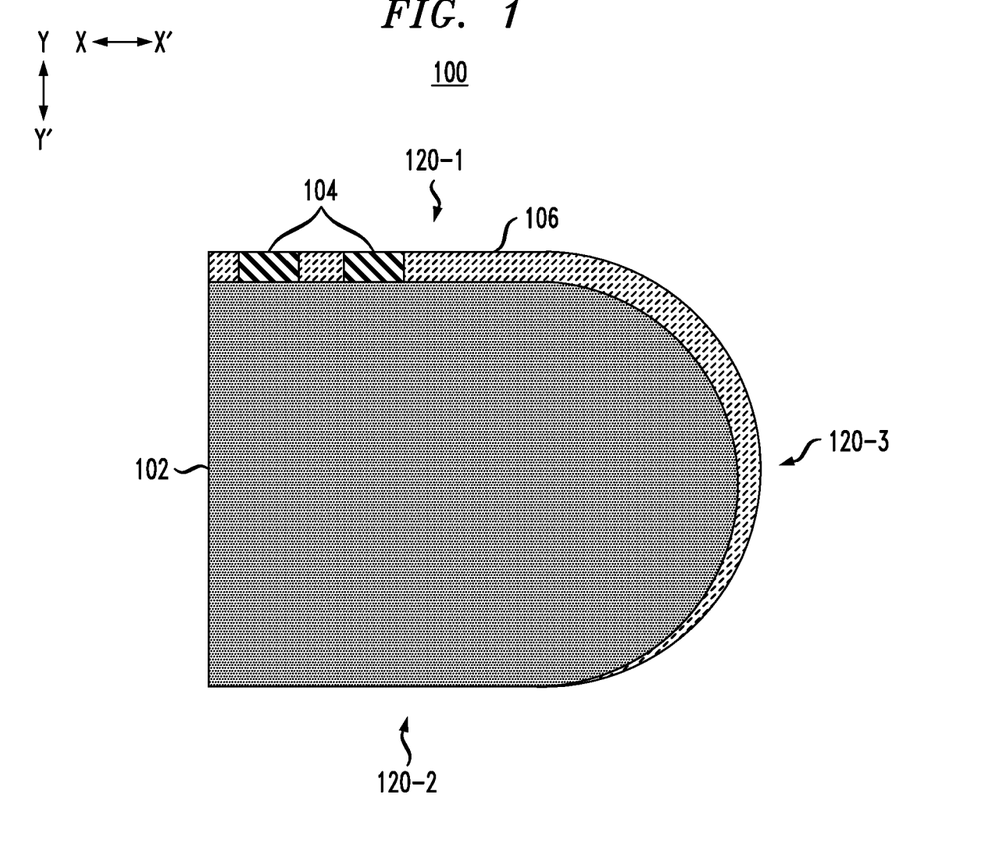
FIG. 1 depicts a side cross-sectional view of a wafer bevel with contacts in a patterned metal layer, according to an embodiment of the invention.

FIG. 1 shows a side cross-sectional view 100 of a substrate or wafer 102, with a top surface or front side 120-1, a back side 120-2 and a bevel edge 120-3. The wafer 102 may comprise a semiconductor substrate formed of silicon (Si), although other suitable materials may be used. For example, the wafer 102 can include any suitable substrate structure, e.g., a bulk semiconductor, a semiconductor-on-insulator (SOI) substrate, etc. In one example, the wafer 102 can include a silicon-containing material. Illustrative examples of Si-containing materials suitable for the wafer 102 can include, but are not limited to, Si, silicon germanium (SiGe), carbon-doped silicon germanium carbide (SiGe:C), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc.

The wafer 102 may have a height or vertical thickness (in direction Y-Y') in the range of 200 micrometers (μm) to 1 millimeter (mm). The wafer 102 may have a horizontal thickness or width (in direction X-X') selected as desired for a particular application, such as based on a desired number of MRAM or other memory elements or device structures to be formed thereon. While FIGS. 1-9 illustrate formation of two MTJ pillars or MRAM stacks, it should be appreciated that more or fewer than two MTJ pillars or MRAM stacks may be formed as desired. Further, while FIGS. 1-9 illustrate the formation of and removal of metal materials from one bevel edge of the substrate or wafer 102, it should be appreciated that such materials may be formed and removed from an entire bevel edge of the substrate or wafer 102.

The FIG. 1 structure is shown after bottom contact metallization, with exposed metal bottom electrode pads 104 formed on the front surface or top side 120-1 of the wafer 102. The bottom electrode pads 104 are surrounded by a dielectric or non-conductive layer 106 that wraps at least partially around the bevel edge 120-3 of the wafer 102 as illustrated. The bottom electrode pads 104 may be formed of various materials, including but not limited to tungsten (W), titanium (Ti), tantalum (Ta), ruthenium (Ru), hafnium (Hf), zirconium (Zr), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$)), transition metal aluminides (e.g. titanium aluminide ($Ti_3Al$), zirconium aluminide (ZrAl)), tantalum carbide (TaC), tantalum magnesium carbide (TaMgC), or any suitable combination of these materials. The dielectric layer 106 may be formed of any suitable dielectric or non-conducting material, including but not limited to silicon oxide (SiOx), silicon nitride (SiN), silicon carbide (SiC), silicon oxynitride carbon (SiOCN) and nitrogen-doped SiN, a low-k dielectric, etc.

The bottom electrode pads 104 may each have a width or horizontal thickness (in direction X-X') in the range of 20 to 200 nanometers (nm), and a height or vertical thickness (in direction Y-Y') in the range of 100 to 500 nm to match a height of the top surface of the dielectric layer 106 formed on the front surface or top side 120-1 of the wafer 102 (e.g., following patterning, metallization and planarization which may utilize chemical mechanical planarization (CMP)). As illustrated, the thickness of the dielectric layer 106 is not necessarily uniform (e.g., the thickness of the dielectric layer 106 may be thinner on the bevel edge 120-3 of the wafer 102).

Figure 2:
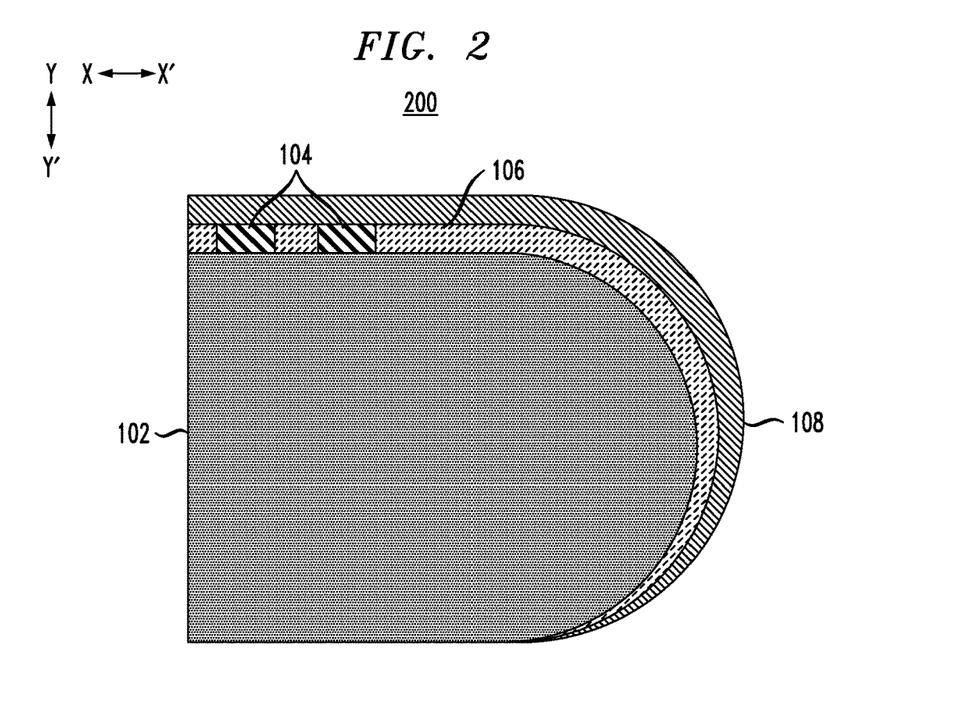
FIG. 2 depicts a side cross-sectional view of the FIG. 1 structure following formation of a sacrificial buffer layer, according to an embodiment of the invention.

FIG. 2 shows a side cross-sectional view 200 of the FIG. 1 structure following formation of a sacrificial buffer layer 108. The sacrificial buffer layer 108 is formed over the dielectric layer 106 and the exposed top surfaces of the bottom electrode pads 104. The sacrificial buffer layer 108 may be formed with a height or vertical thickness (in direction Y-Y') on the front surface of top side 120-1 of the wafer 102 in the range of 100 to 500 nm. The sacrificial buffer layer 108, similar to the dielectric layer 106, may be thinner on the bevel edge 120-3 of the wafer 102. The sacrificial buffer layer 108 may be formed using a blanket deposition process. The sacrificial buffer layer 108 may be formed of $SiO_x$, SiN, or SiC, or another suitable material such as silicon oxynitride (SiON), carbon nitrogen doped SiN, etc.

Figure 3:
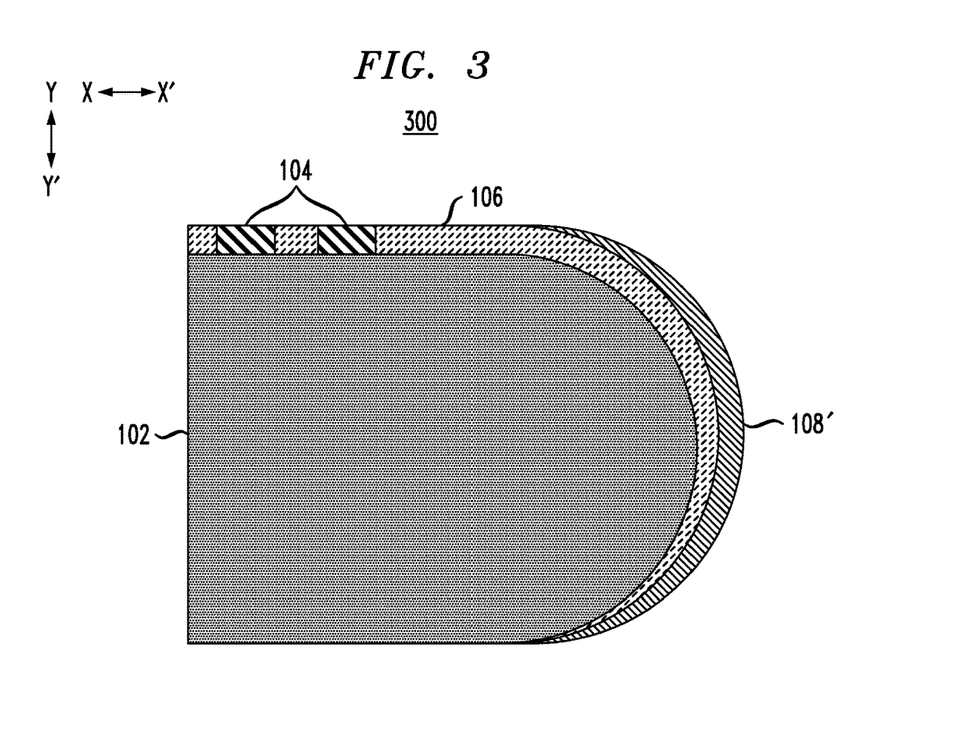
FIG. 3 depicts a side cross-sectional view of the FIG. 2 structure following etch-back of the sacrificial buffer layer, according to an embodiment of the invention.

FIG. 3 shows a side cross-sectional view 300 of the FIG. 2 structure following etch-back of the sacrificial buffer layer 108 to remove the sacrificial buffer layer material from the front surface or top side 120-1 of the wafer 102. This leaves a remaining sacrificial buffer layer 108' only on the bevel edge 120-3 of the wafer 102 as shown in FIG. 3. The etch-back may utilize RIE with a dielectric etching chemistry containing fluorocarbons (e.g., tetrafluoromethane ($CF_4$), fluoroform ($CHF_3$), difluoromethane ($CH_2F_2$), octafluorocyclobutane ($C_4F_8$), hexafluoro-2-butyne ($C_4F_6$), etc.), nitrogen trifluoride ($NF_3$) or sulfur hexafluoride ($SF_6$) along with oxygen, nitrogen, argon, etc. This processing may be done in a standard ME chamber, where plasma does not reach the edge of the wafer 102. As a result, the sacrificial buffer layer 108' remains on the bevel edge 120-3 of the wafer 102.

Figure 4:
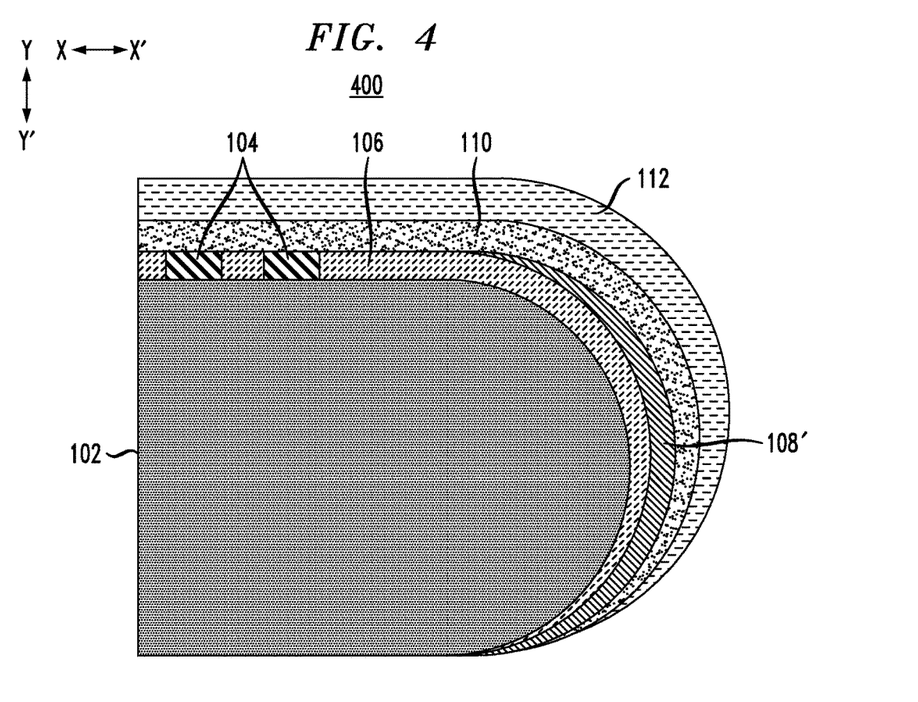
FIG. 4 depicts a side cross-sectional view of the FIG. 3 structure following deposition of a stack of one or more metals and a hard mask layer, according to an embodiment of the invention.

FIG. 4 shows a side cross-sectional view 400 of the FIG. 3 structure following formation of a metal stack 110 and a hard mask layer 112. The metal stack 110 may include one or more metal layers that are blanket deposited over the structure. The hard mask layer 112 is used in later processing to pattern features in the metal stack 110. In some embodiments, the metal stack 110 includes a stack of layers for a memory element, such as an MRAM stack for forming MTJ pillars after patterning with the hard mask layer 112. An MRAM stack may include multiple layers formed of various metals. For example, an MRAM stack may include: (i) a seed layer (e.g., of tantalum (Ta) or another suitable material); (ii) a reference layer (e.g., which may be a magnetic layer or multi-layer that is cobalt (Co)-based, such as a Co-rich cobalt-iron (Co—Fe) alloy, a Co-rich cobalt-nickel (Co—Ni) alloy, a cobalt-boron (Co—B) alloy, etc.); (iii) a polarization enhancement layer (PEL) (e.g., which may formed of a cobalt-iron-boron (Co—Fe—B) alloy); (iv) a barrier layer (e.g., formed of magnesium oxide (MgO), aluminum oxide ($AlO_x$), magnesium titanium oxide (MgTiO), etc.); and (v) a free layer (e.g., formed of a Co—Fe—B alloy with possible additions of other suitable transition metals). It should be appreciated, however, that other materials and metal stacks may be used in other embodiments.

The hard mask layer 112 may be formed of tungsten (W), tungsten nitride (WN), Ta, tantalum nitride (TaN), titanium (Ti), titanium nitride (TiN), ruthenium (Ru), Cr, vanadium (V), palladium (Pd), platinum (Pt), scandium (Sc), aluminum (Al), copper (Cu), or other high melting point metals or conductive metal nitride materials.

The metal stack 110 may have a height or vertical thickness (in direction Y-Y') in the range of 50 to 200 nm. The hard mask layer 112 may have a height or vertical thickness (in direction Y-Y') in the range of 50 to 500 nm. The metal stack 110 and hard mask layer 112, similar to the sacrificial buffer layer 108 and dielectric layer 106, may be thinner on the bevel edge 120-3 of the wafer 102.

Figure 5:
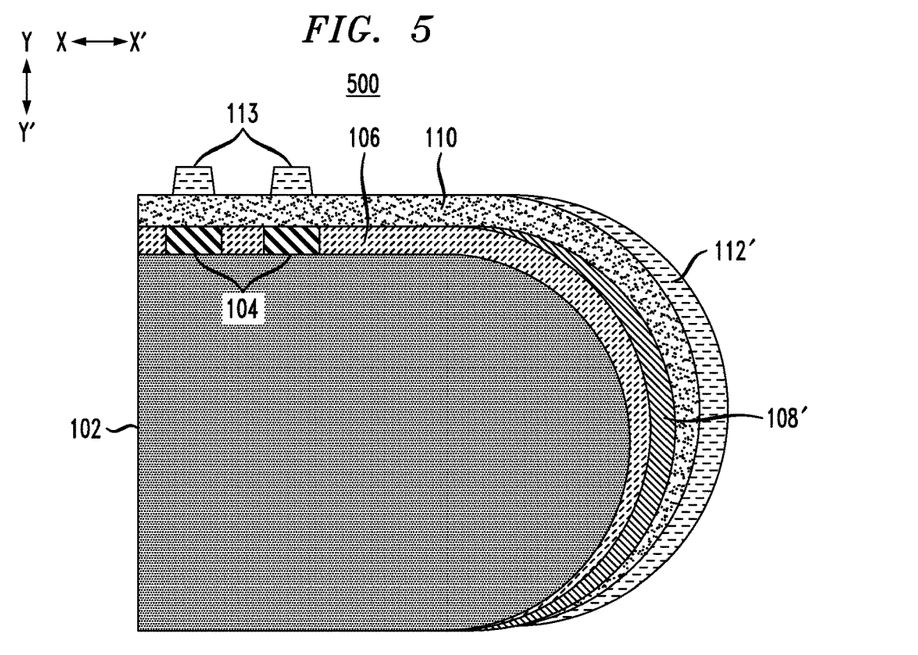
FIG. 5 depicts a side cross-sectional view of the FIG. 4 structure following patterning of the hard mask layer, according to an embodiment of the invention.

FIG. 5 shows a side cross-sectional view 500 of the FIG. 4 structure following patterning of the hard mask layer 112. The hard mask layer 112 may be patterned by etching the hard mask layer 112 (e.g., using ME). The patterned hard mask layer 113 is used to transfer the pattern into the metal stack 110 in later processing described below. The etching of the hard mask layer 112 results in the patterned hard mask layer 113 on the front surface or top side 120-1 of the wafer 102. A portion of the hard mask layer 112' remains on the bevel edge 120-3 of the wafer 102 as illustrated (e.g., this step does not remove the hard mask material from the bevel).

Figure 6:
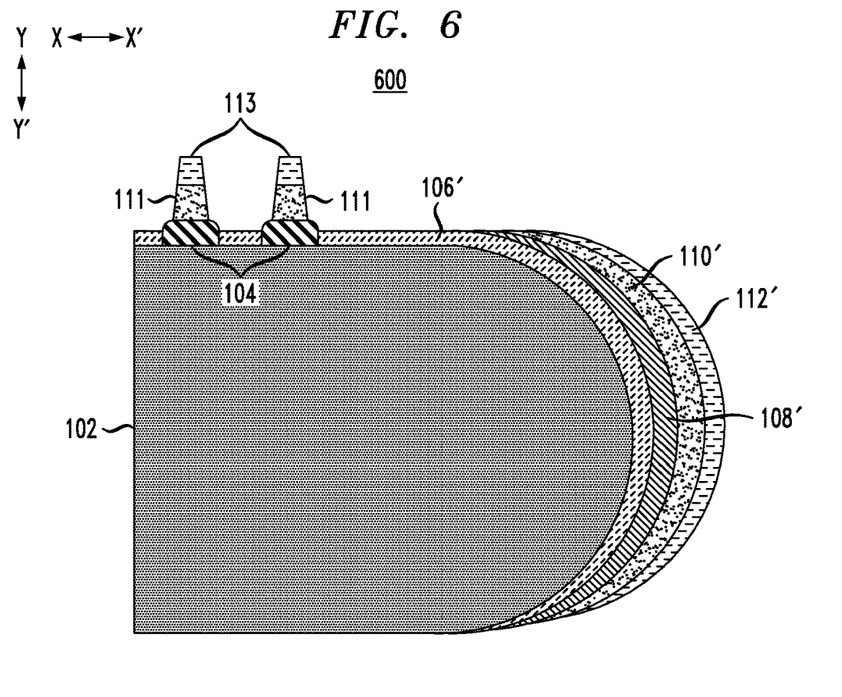
FIG. 6 depicts a side cross-sectional view of the FIG. 5 structure following transfer of the hard mask layer pattern to the stack of one or more metals, according to an embodiment of the invention.
Figure 7:
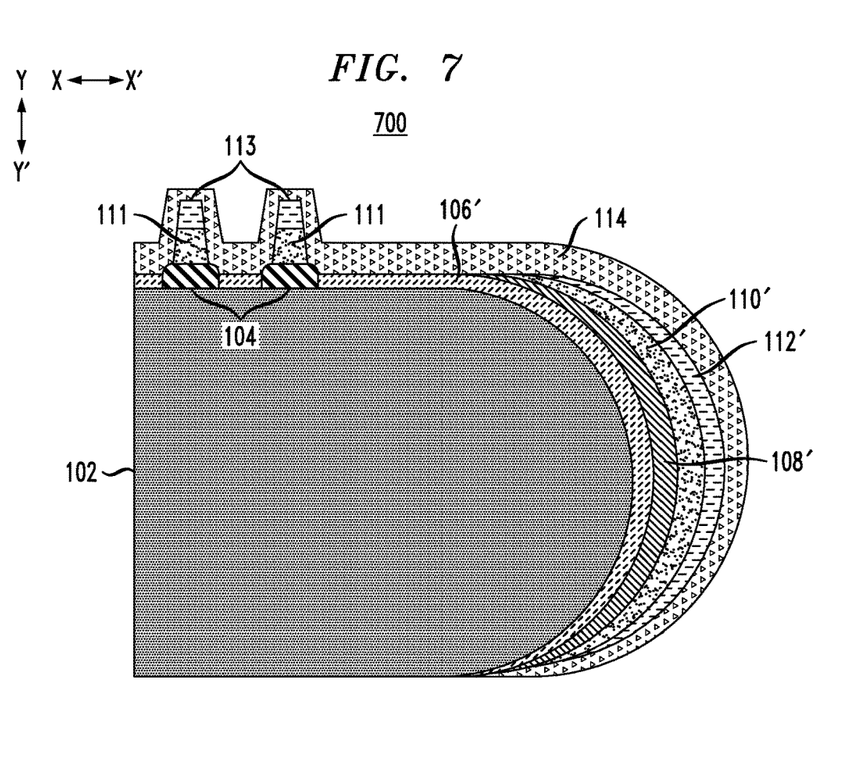
FIG. 7 depicts a side cross-sectional view of the FIG. 6 structure following formation of an encapsulation layer, according to an embodiment of the invention.

FIG. 6 shows a side cross-sectional view 600 of the FIG. 5 structure following transfer of the patterned hard mask layer 113 into the metal stack 110 to form MTJ pillars 111. This step may utilize IBE. Similar to the FIG. 5 processing, a portion of the metal stack 110' remains on the bevel edge 120-3 of the wafer 102 as illustrated FIG. 7 shows a side cross-sectional view 700 of the FIG. 6 structure following formation of an encapsulation layer 114. The encapsulation layer 114 may be formed using CVD, PECVD or PVD based deposition of SiN or SiOx, SiCN or SiCN(H) or SiC. The encapsulation layer 114 may have a height or vertical thickness (in direction Y-Y') in the range of 10 nm to 300 nm. Similar to layers 106 through 112, the encapsulation layer 114 may be thinner at the bevel edge 120-3 of the wafer 102.

Figure 8:
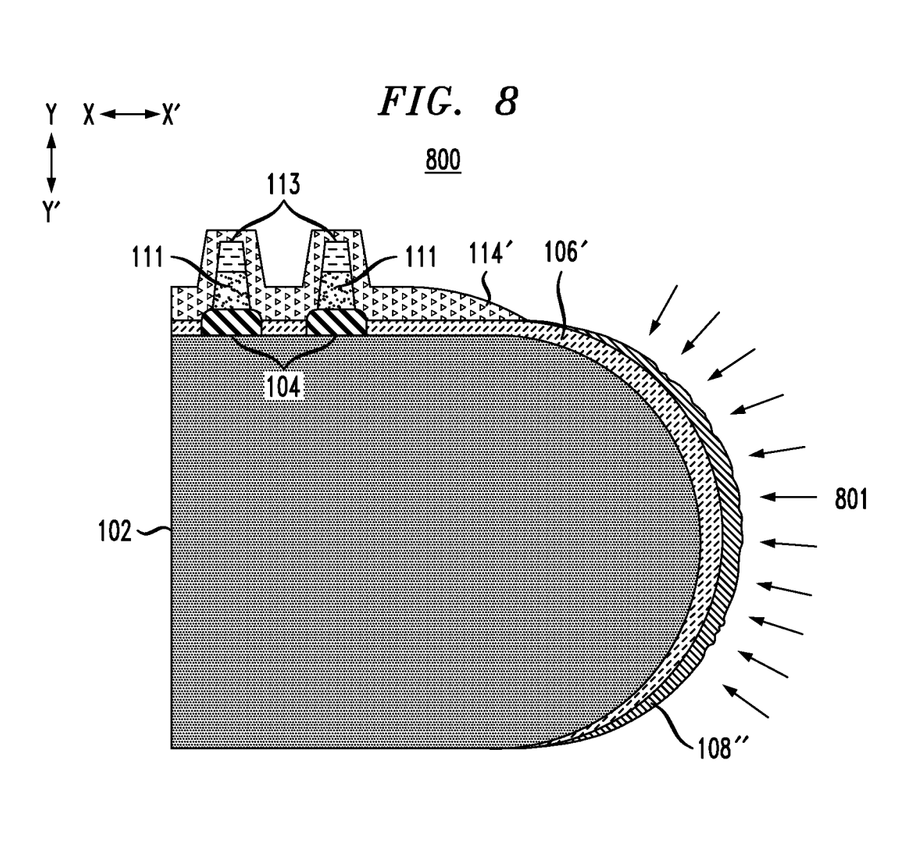
FIG. 8 depicts a side cross-sectional view of the FIG. 7 structure following a bevel etch, according to an embodiment of the invention.

FIG. 8 shows a side cross-sectional view 800 of the FIG. 7 structure following a bevel etch 801. The bevel etch 801 is used to remove metal materials at the bevel edge 120-3 of the wafer 102, which also removes portions of the encapsulation material at the front surface of top side 120-1 of the wafer 102 resulting in encapsulation layer 114'. The bevel metal removal uses a bevel dry etch (e.g., bevel-RIE). This step may damage underlying layers, as shown by the damaged sacrificial buffer layer 108". Advantageously, the sacrificial buffer layer 108" prevents damage from reaching underlying films (e.g., the dielectric layer 106).

Figure 9:
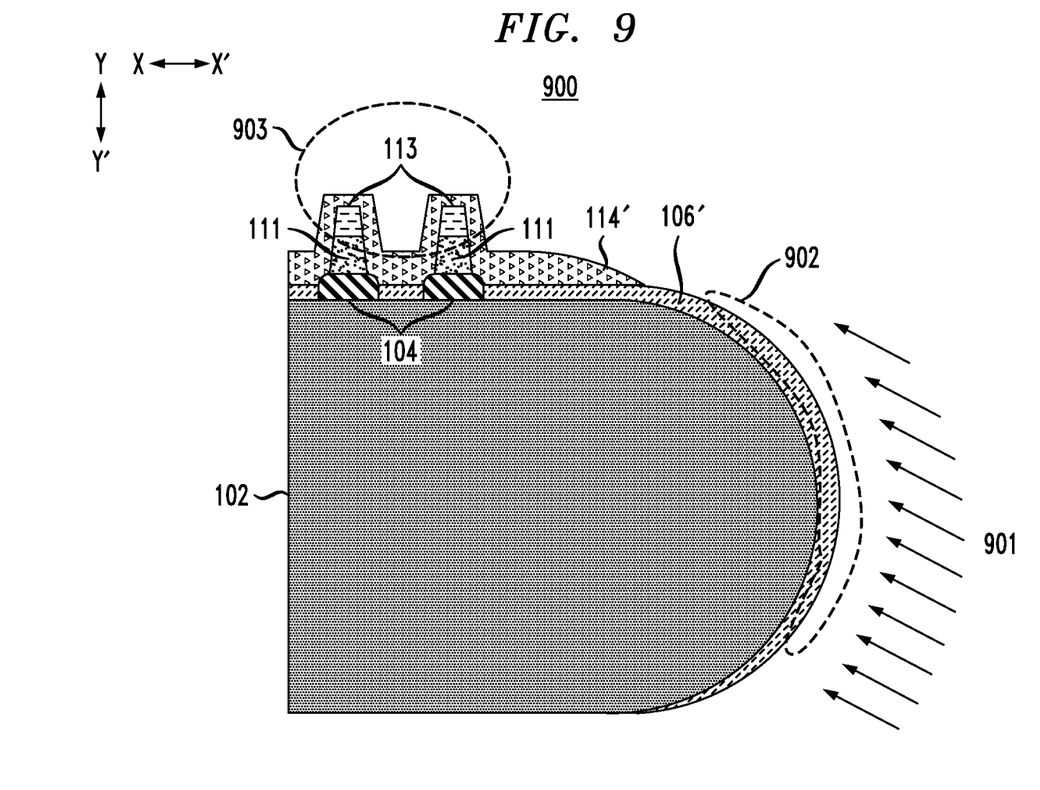
FIG. 9 depicts a side cross-sectional view of the FIG. 8 structure following removal of the sacrificial buffer layer, according to an embodiment of the invention.

FIG. 9 shows a side cross-sectional view 900 of the FIG. 8 structure following removal 901 of the damaged sacrificial buffer layer 108". The remaining, damaged sacrificial buffer layer 108" may be removed using a wet bevel etch (e.g., using hydrofluoric acid (HF) or dilute HF with a concentration ranging from 1:10 to 1:3000) or a high angle IBE (e.g., with an angle greater than 90 degrees). As shown, the sacrificial buffer layer 108" is removed in region 902 while there is no etching in region 903 at the front surface or top side 120-1 of the wafer 102.

In some embodiments, a method of forming a semiconductor structure comprises forming one or more contacts over a top surface of a substrate, forming a dielectric layer surrounding the one or more contacts over the top surface and a bevel edge of the substrate, and forming a sacrificial buffer layer over the dielectric layer on the top surface and the bevel edge of the substrate. The method also comprises removing portions of the sacrificial buffer layer formed over the dielectric layer on the top surface of the substrate leaving the sacrificial buffer layer on the bevel edge of the substrate, and patterning one or more device structures comprising one or more metal layers over the one or more contacts, wherein patterning the one or more device structures comprises removing portions of the one or more metal layers formed over the dielectric layer on the top surface of the substrate leaving the one or more metal layers on the bevel edge of the substrate. The method further comprises forming an encapsulation layer over the one or more device structures and the dielectric layer on the top surface of the substrate, and performing a bevel dry etch to remove the encapsulation layer and the one or more metal layers on the bevel edge of the substrate, the bevel dry etch damaging the sacrificial buffer layer on the bevel edge underneath the one or more metal layers. The method further comprises removing the damaged sacrificial buffer layer from the bevel edge of the substrate.

The sacrificial buffer layer may comprise a dielectric material. The dielectric material may comprise at least one of $SiO_x$, SiN and SiC.

The one or more device structures may comprise one or more MRAM structures, and the one or more metal layers provide at least a portion of a MTJ stack for the one or more MRAM structures. The one or more metal layers providing said at least a portion of the MTJ stack may comprise at least one of Co, Fe, Ni, B, Pt, Cr, MgO, $AlO_x$, MgTiO, and alloys thereof.

Patterning the one or more device structures may comprise blanket depositing the one or more metal layers over the one or more contacts and the dielectric layer on the top surface of the substrate and over the sacrificial buffer layer on the bevel edge of the substrate, and blanket depositing a hard mask layer over the one or more metal layers on the top surface of the substrate and on the bevel edge of the substrate. Patterning the one or more device structures may further comprise performing RIE of the hard mask layer to form a patterned hard mask layer over the dielectric layer on the top surface of the substrate and leaving the hard mask layer on the bevel edge of the substrate, and performing IBE of the one or more metal layers over the dielectric layer on the top surface of the substrate exposed by the patterned hard mask layer leaving the hard mask layer and the one or more metal layers on the bevel edge of the substrate.

Forming the encapsulation layer may comprise blanket depositing the encapsulation layer over the one or more device structures and dielectric layer on the top surface of the substrate and over the one or more metal layers on the bevel edge of the substrate. Performing the bevel dry etch may comprise performing RIE of the encapsulation layer and the one or more metal layers on the bevel edge of the substrate. The RIE of the encapsulation layer and the one or more metal layers on the bevel edge of the substrate damages a surface of the sacrificial buffer layer on the bevel edge of the substrate. Damaging the surface of the sacrificial buffer layer may comprise pitting the surface of the sacrificial buffer layer, forming one or more needles on the surface of the sacrificial buffer layer, or combinations thereof.

Removing the damaged sacrificial buffer layer may comprise performing a bevel wet etch. The bevel wet etch may comprise HF or dilute HF with a concentration in the range of about 1:10 to 1:3000.

Removing the damaged sacrificial buffer layer may comprise performing high angle IBE. The high angle IBE may use an angle greater than 90 degrees.

In some embodiments, a semiconductor structure comprises a substrate, one or more contacts disposed on a top surface of the substrate, a dielectric layer surrounding the one or more contacts disposed on the top surface of the substrate and a bevel edge of the substrate, a sacrificial buffer layer disposed over the dielectric layer on the bevel edge of the substrate, and one or more device structures patterned over the one or more contacts on the top surface of the substrate, the one or more device structures comprising one or more metal layers also disposed over the sacrificial buffer layer on the bevel edge of the substrate. The semiconductor structure may also comprise a hard mask layer disposed over the one or more device structures and the one or more metal layers on the bevel edge of the substrate, and an encapsulation layer disposed over (i) the hard mask layer, the one or more device structures and the dielectric layer on the top surface of the substrate and (ii) the hard mask layer on the bevel edge of the substrate.

The sacrificial buffer layer may comprise a dielectric material. The dielectric material may comprise at least one of $SiO_x$, SiN and SiC.

In some embodiments, an integrated circuit comprises an MRAM structure comprising a substrate, one or more contacts disposed on a top surface of the substrate, a dielectric layer surrounding the one or more contacts disposed on the top surface of the substrate and a bevel edge of the substrate, a sacrificial buffer layer disposed over the dielectric layer on the bevel edge of the substrate, and one or more MTJ stacks for one or more MRAM elements patterned over the one or more contacts on the top surface of the substrate, the one or more MTJ stacks comprising one or more metal layers also disposed over the sacrificial buffer layer on the bevel edge of the substrate. The MRAM structure also comprises a hard mask layer disposed over the one or more MTJ stacks and the one or more metal layers on the bevel edge of the substrate, and an encapsulation layer disposed over (i) the hard mask layer, the one or more MTJ stacks and the dielectric layer on the top surface of the substrate and (ii) the hard mask layer on the bevel edge of the substrate.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein.

In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:
    forming one or more contacts over a top surface of a substrate;
    forming a dielectric layer surrounding the one or more contacts over the top surface and a bevel edge of the substrate;
    forming a sacrificial buffer layer over the dielectric layer on the top surface and the bevel edge of the substrate;
    removing portions of the sacrificial buffer layer formed over the dielectric layer on the top surface of the substrate leaving the sacrificial buffer layer on the bevel edge of the substrate;
    patterning one or more device structures comprising one or more metal layers over the one or more contacts, wherein patterning the one or more device structures comprises removing portions of the one or more metal layers formed over the dielectric layer on the top surface of the substrate leaving the one or more metal layers on the bevel edge of the substrate;
    forming an encapsulation layer over the one or more device structures and the dielectric layer on the top surface of the substrate;
    performing a bevel dry etch to remove the encapsulation layer and the one or more metal layers on the bevel edge of the substrate, the bevel dry etch damaging the sacrificial buffer layer on the bevel edge underneath the one or more metal layers; and
    removing the damaged sacrificial buffer layer from the bevel edge of the substrate.

2. The method of claim 1, wherein the sacrificial buffer layer comprises a dielectric material.

3. The method of claim 2, wherein the dielectric material comprises at least one of silicon oxide ($SiO_x$), silicon nitride (SiN) and silicon carbide (SiC).

4. The method of claim 1, wherein the one or more device structures comprise one or more magnetic random-access memory (MRAM) structures, and wherein the one or more metal layers provide at least a portion of a magnetic tunnel junction (MTJ) stack for the one or more MRAM structures.

5. The method of claim 4, wherein the one or more metal layers providing said at least a portion of the MTJ stack comprise at least one of cobalt (Co), iron (Fe), nickel (Ni), boron (B), platinum (Pt), chromium (Cr), magnesium oxide (MgO), aluminum oxide ($AlO_x$), magnesium titanium oxide (MgTiO), and alloys thereof.

6. The method of claim 1, wherein patterning the one or more device structures comprises:
    blanket depositing the one or more metal layers over the one or more contacts and the dielectric layer on the top surface of the substrate and over the sacrificial buffer layer on the bevel edge of the substrate; and blanket depositing a hard mask layer over the one or more metal layers on the top surface of the substrate and on the bevel edge of the substrate.

7. The method of claim 6, wherein patterning the one or more device structures further comprises:

reactive-ion etching the hard mask layer to form a patterned hard mask layer over the dielectric layer on the top surface of the substrate and leaving the hard mask layer on the bevel edge of the substrate; and ion-beam etching the one or more metal layers over the dielectric layer on the top surface of the substrate exposed by the patterned hard mask layer leaving the hard mask layer and the one or more metal layers on the bevel edge of the substrate.

8. The method of claim 7, wherein forming the encapsulation layer comprises blanket depositing the encapsulation layer over the one or more device structures and dielectric layer on the top surface of the substrate and over the one or more metal layers on the bevel edge of the substrate.

9. The method of claim 8, wherein performing the bevel dry etch comprises reactive-ion etching the encapsulation layer and the one or more metal layers on the bevel edge of the substrate.

10. The method of claim 9, wherein the reactive-ion etching of the encapsulation layer and the one or more metal layers on the bevel edge of the substrate damages a surface of the sacrificial buffer layer on the bevel edge of the substrate.

11. The method of claim 10, wherein damaging the surface of the sacrificial buffer layer comprises pitting the surface of the sacrificial buffer layer.

12. The method of claim 10, wherein damaging the surface of the sacrificial buffer layer comprises forming one or more needles on the surface of the sacrificial buffer layer.

13. The method of claim 1, wherein removing the damaged sacrificial buffer layer comprises performing a bevel wet etch.

14. The method of claim 13, wherein the bevel wet etch comprises hydrofluoric acid or dilute hydrofluoric acid with a concentration in the range of about 1:10 to 1:3000.

15. The method of claim 1, wherein removing the damaged sacrificial buffer layer comprises performing high angle ion-beam etching.

16. The method of claim 15, wherein the high angle ion-beam etching uses an angle greater than 90 degrees.

* * * * *